(12) United States Patent
Boerstler et al.

(10) Patent No.: US 7,786,813 B2
(45) Date of Patent: *Aug. 31, 2010

(54) INTERLEAVED VOLTAGE CONTROLLED OSCILLATOR

(75) Inventors: David W. Boerstler, Round Rock, TX (US); Eskinder Hailu, Austin, TX (US); Jieming Qi, Austin, TX (US); Mike Shen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 159 days.

This patent is subject to a terminal disclaimer.

(21) Appl. No.: 12/098,490

(22) Filed: Apr. 7, 2008

(65) Prior Publication Data

US 2008/0186104 A1 Aug. 7, 2008

Related U.S. Application Data

(63) Continuation of application No. 11/458,753, filed on Jul. 20, 2006, now Pat. No. 7,391,277.

(51) Int. Cl.
H03K 3/03 (2006.01)

(52) U.S. Cl. .......................... 331/57; 331/176; 331/185; 331/186

(58) Field of Classification Search .................... 331/57, 331/176, 185, 186
See application file for complete search history.

(56) References Cited

U.S. PATENT DOCUMENTS

| 5,285,116 | A | 2/1994 | Thaik |
|---|---|---|---|
| 5,602,462 | A | 2/1997 | Stich et al. |
| 5,938,677 | A | 8/1999 | Boukhny et al. |
| 6,043,718 | A | 3/2000 | Diniz et al. |
| 6,356,515 | B1 | 3/2002 | Kumita et al. |
| 6,651,202 | B1 | 11/2003 | Phan |
| 6,718,474 | B1 | 4/2004 | Somers et al. |
| 6,809,602 | B2 | 10/2004 | Boerstler et al. |
| 2004/0063414 | A1 | 4/2004 | Kasperkovitz |
| 2006/0223454 | A1 | 10/2006 | Westwick et al. |
| 2006/0253204 | A1 | 11/2006 | Papanikolaou et al. |
| 2007/0155341 | A1 | 7/2007 | Haiut |
| 2008/0191809 | A1* | 8/2008 | Boerstler et al. .............. 331/57 |
| 2008/0222585 | A1* | 9/2008 | Boerstler et al. .............. 716/5 |

* cited by examiner

*Primary Examiner*—Joseph Chang
*Assistant Examiner*—Jeffrey Shin
(74) *Attorney, Agent, or Firm*—Cantor Colburn LLP; Matthew Talpis

(57) ABSTRACT

An interleaved voltage-controlled oscillator (VCO) is disclosed. The VCO includes a ring circuit comprising a series connection of main logic inverter gates, a plurality of delay elements connected in parallel with a selected sequence of the main logic inverter gates, at least one temperature compensation circuit comprising a logic inverter gate in series connection with one or more field effect transistors, the field effect transistor responsive to a compensating voltage input that is proportional to temperature, and an electronic circuit in signal communication with the at least one temperature compensation circuit and configured to provide a voltage signal responsive to temperature. Each delay element includes a feedforward section, comprising controls for regulating signal transmission through feedforward elements responsive to one or more control voltages, and a proportional section, comprising controls for regulating signal transmission through at least one logic inverter gate.

7 Claims, 6 Drawing Sheets

INTERLEAVED VOLTAGE CONTROLLED OSCILLATOR

CROSS-REFERENCE TO RELATED APPLICATIONS

This application is a continuation of U.S. patent application Ser. No. 11/458,753, filed Jul. 20, 2006, now U.S Pat. 7,319,277, the disclosure of which is incorporated by reference herein in its entirety.

TRADEMARK

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to circuits for generating microprocessor clocks, and particularly to circuits for generating clocks using a voltage-controlled oscillator.

2. Description of Background

High-frequency voltage-controlled oscillators (VCOs) are extremely important for applications such as processor clock generation and/or distribution, wired and/or wireless communication, system synchronization, and frequency synthesis. Research on VCOs for the past decade has been concentrated in the areas of high frequency, lower jitter, lower operating voltage and power, and increasing the frequency tuning range. Many of these design goals are achieved only at the expense of some or all of the other performance objectives.

Variability of oscillator frequency with respect to temperature, as well as process variation and voltage changes, can have a significant effect on performance, cost, and yield. Complementary metal-oxide semiconductor (CMOS) ring oscillators are commonly used for microprocessor clock generation and high speed input/output (I/O). These oscillators typically have a fequency sensitivity to temperature of about 0.1% to 0.2%/degree C. Operation in applications that require extremely wide temperature ranges, such as mil-spec (military specification) of −55 Celsius (C) to +125C may not be feasible. Accordingly, the state of the art may be advanced by a voltage controlled oscillator that overcomes these drawbacks.

SUMMARY OF THE INVENTION

The shortcomings of the prior art are overcome and additional advantages are provided through the provision of a voltage controlled oscillator having temperature compensation.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

Technical Effects

As a result of the summarized invention, technically we have achieved a solution that reduces the effect of environmental temperature on the operating performance of interleaved voltage controlled oscillators.

BRIEF DESCRIPTION OF THE DRAWINGS

The subject matter, which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

An embodiment of the invention includes a VCO having a new delay element with a temperature compensation means included within an additional branch in the control path interleaved within the oscillator. A compensating voltage input is supplied to the temperature compensation means by a circuit that produces a voltage proportional to absolute temperature (also herein referred to as PTAT). The PTAT voltage is amplified and combined with a fixed DC offset voltage.

Figure 1:
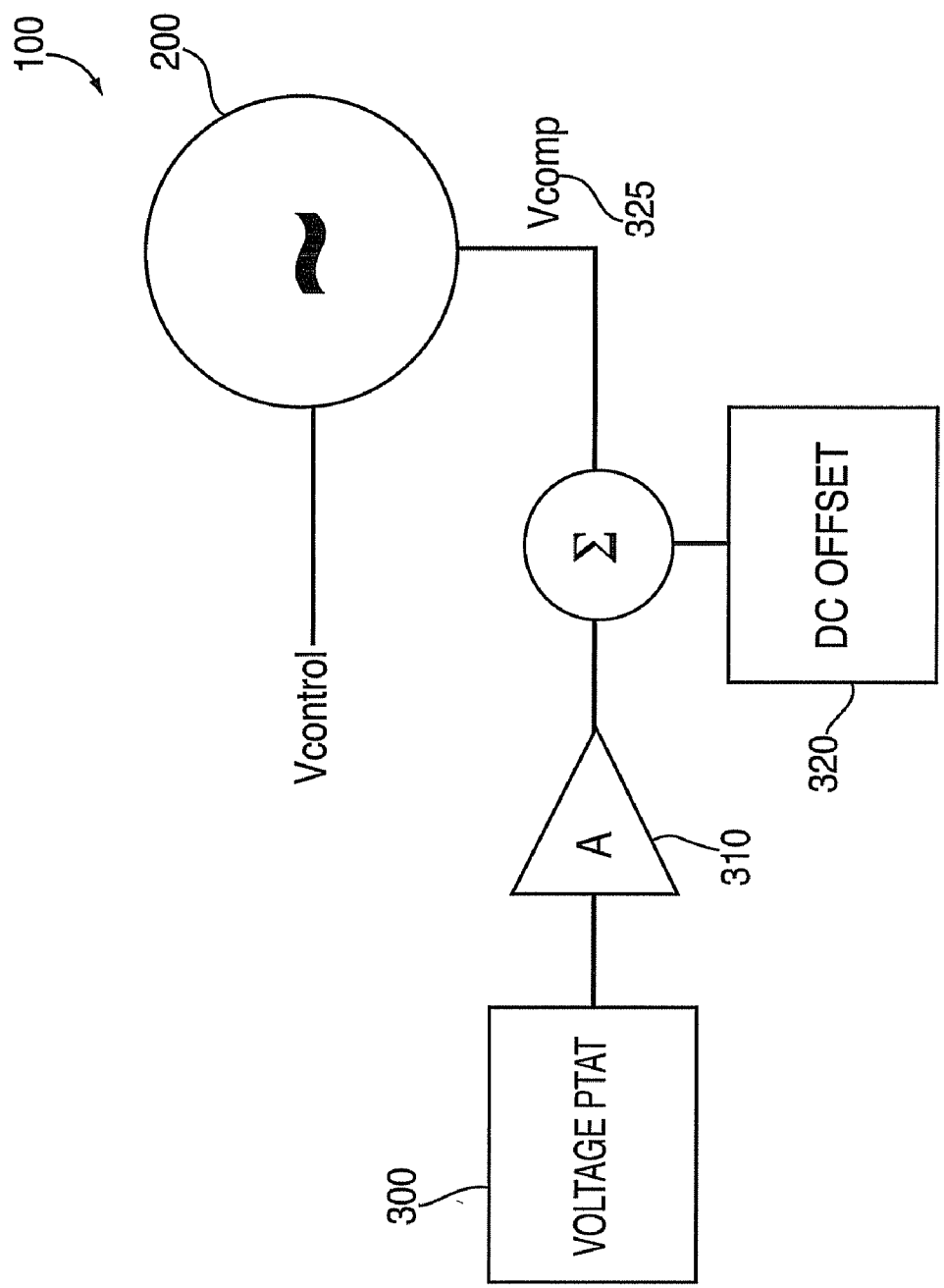
FIG. 1 illustrates one example of a temperature compensated VCO system in accordance with an embodiment of the invention.

Referring now to FIG. 1, an exemplary embodiment of a temperature compensated VCO system 100 is depicted. The system 100 comprises an interleaved VCO 200, an electronic circuit 300 configured to provide a voltage signal responsive to temperature, an amplifier 310 in connection with the electronic circuit 300 to amplify the PTAT voltage signal; and a DC offset generator 320 configured to adjust the voltage of the amplified PTAT voltage signal, thereby providing the compensating voltage input, Vcomp, represented by reference numeral 325. In an embodiment, the electronic circuit 300 provides a voltage signal directly proportional to absolute temperature.

Figure 2:
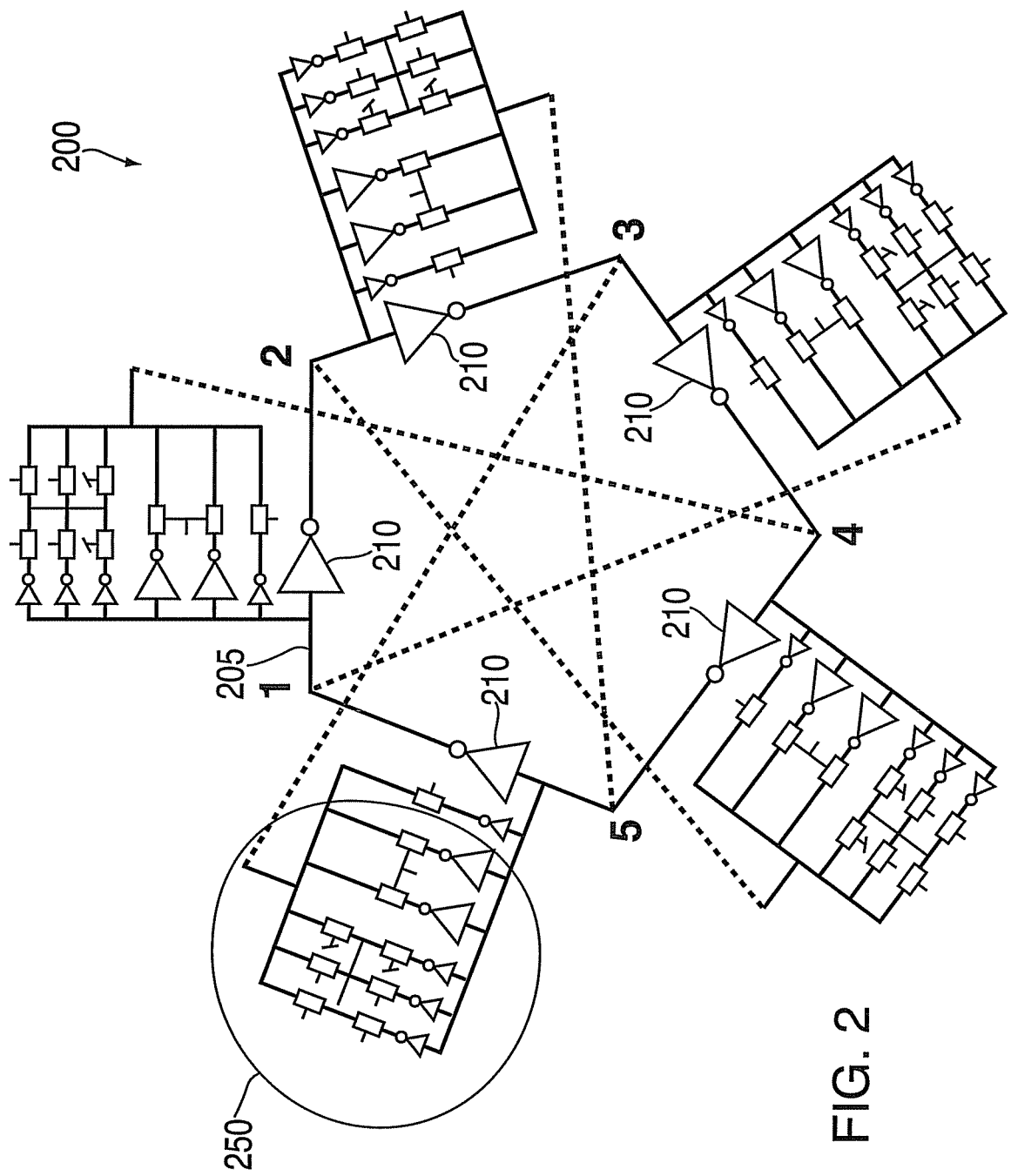
FIG. 2 illustrates one example of an interleaved VCO in accordance with an embodiment of the invention.

Referring now to FIG. 2, an exemplary embodiment of the interleaved VCO 200 is depicted. In an embodiment, the VCO 200 comprises a ring circuit 205 comprising a series connection of main logic inverter gates 210; and a plurality of delay elements (as shown within the circle indicated by reference numeral 250, and also herein referred to via reference numeral 250), each delay element 250 is connected in parallel with a selected sequence of the main logic inverter gates 210. In an embodiment, the VCO 200 comprises components manufactured with 65 nanometer (nm) technology, employing a lithographic mode of manufacture. As used herein, 65 nm technology will refer to a lithographic mode used for semiconductor manufacturing, as will be appreciated by one skilled in the art.

While an embodiment of the invention has been described having electronic components manufactured with 65 nm technology, it will be appreciated that the scope of the invention is not so limited, and that the invention will also apply to VCO systems using components manufactured with other technologies, such as 45 nm, 90 nm, 130 nm, and other technologies, for example.

Figure 4:
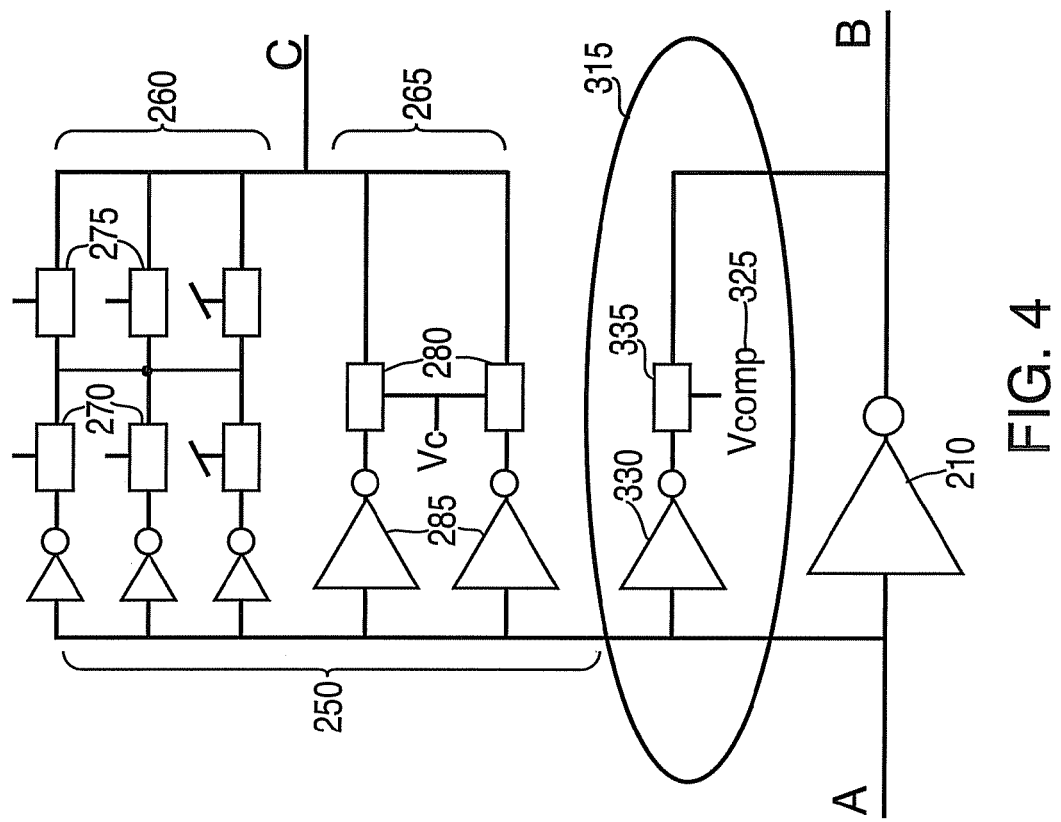
FIG. 4 illustrates another example of a delay element of a VCO in accordance with an embodiment of the invention.
Figure 3:
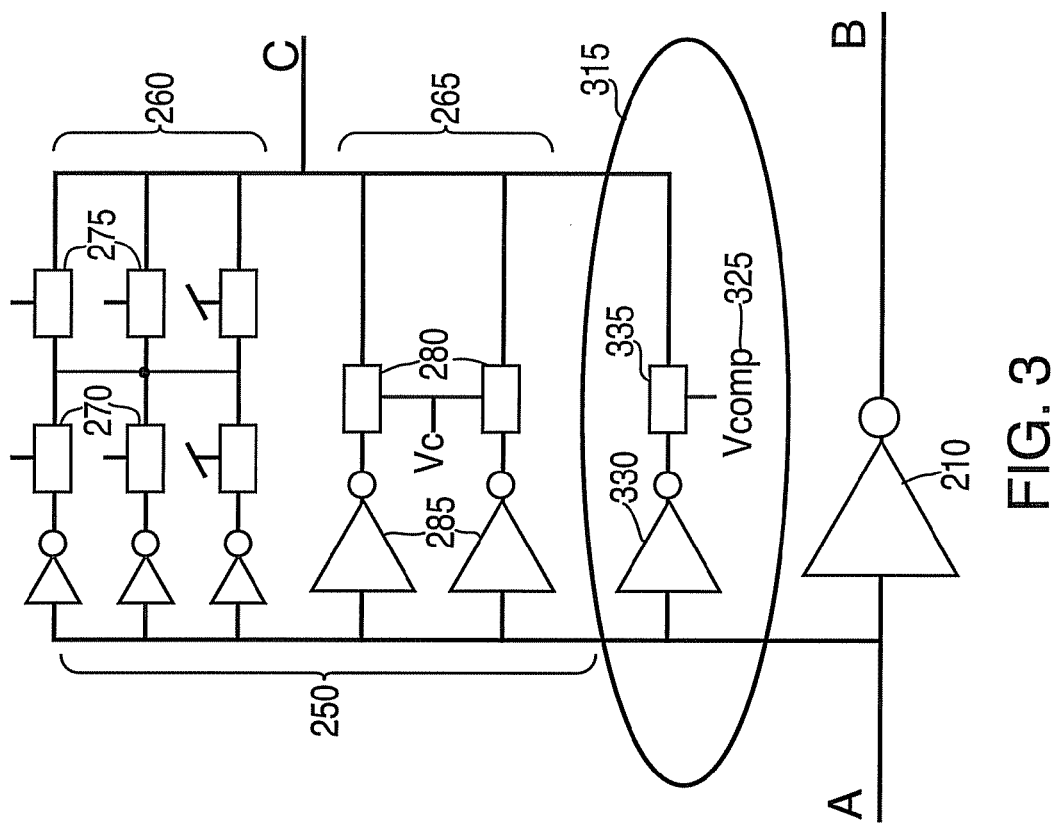
FIG. 3 illustrates one example of a delay element of a VCO in accordance with an embodiment of the invention.

Referring now to FIGS. 3 and 4, exemplary embodiments of the delay element 250 are depicted. In an embodiment, each delay element 250 comprises a feedforward section 260 and a proportional section 265. In an embodiment, the feedforward section 260 comprises controls 270 for regulating signal transmission through feedforward elements 275 responsive to one or more control voltages. In an embodiment, the proportional section 265 comprises controls 280 for regulating signal transmission through at least one logic inverter gate 285.

In an embodiment, the VCO 200 will comprise at least one temperature compensation circuit 315. Each temperature compensation circuit 315 will comprise a logic inverter gate 330 in series connection with one or more field effect transistors 335. The field effect transistor 335 is responsive to the compensating voltage input 325 that is proportional to temperature. As the compensating voltage input 325 increases, a conductance value of the field effect transistor 335 increases, such that as the compensating voltage input 325 increases, the current flow through the logic inverter gate 330 also increases.

Referring now to FIG. 3 specifically, an embodiment of the temperature compensation circuit 315 is depicted. In the embodiment depicted in FIG. 3, the temperature compensation circuit 315 is in signal communication with the electronic circuit 300 (depicted in FIG. 1) configured to provide a voltage signal responsive to temperature and in parallel connection to the delay element 250. In an alternate embodiment, as depicted in FIG. 4, the temperature compensation circuit 315 is in parallel connection to at least one of the main logic inverter gates 210 of the ring circuit 205.

It will be appreciated that in an exemplary embodiment, such as depicted in FIG. 3, the connection of the logic inverter gate 330 in parallel with proportional logic gates 285 of similar size provides that the contribution of effect of the inverter gate 330 can be significant to the overall delay element 250. Similarly, it will be appreciated that in another exemplary embodiment, such as depicted in FIG. 4, the connection of the logic inverter gate 330 in parallel with the main logic inverter gate 210 of greater size provides that the contribution of effect of the inverter gate 330 will be small as compared to that of the main logic inverter gate 210. It will therefore be appreciated by one skilled in the art that for a given change in value of the compensating voltage input 325, the embodiment in FIG. 3 will provide a greater compensation affect than the embodiment in FIG. 4. Accordingly, an embodiment of the invention as depicted in FIG. 3 can provide compensation over a greater range of operating temperatures, while an embodiment of the invention as depicted in FIG. 4 can provide a finer resolution of compensation over a more narrow range of operating temperatures.

In view of the foregoing, the temperature compensated voltage controlled oscillator system 100 performs the method of compensating for temperature in an interleaved VCO.

Figure 5:
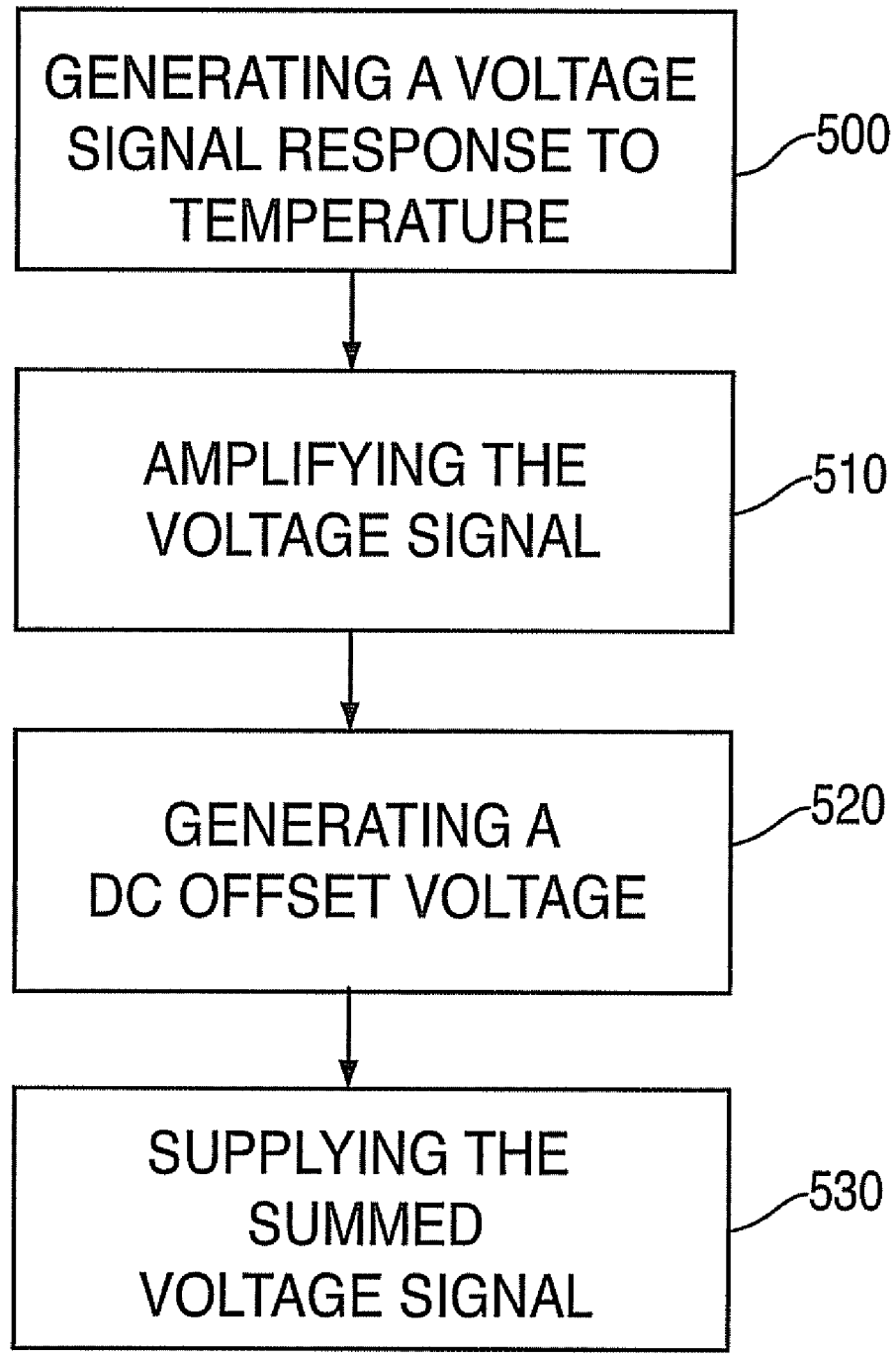
FIG. 5 illustrates one example of a flow chart depicting a method of temperature compensation for a VCO in accordance with an embodiment of the invention.

Referring now to FIG. 5, an exemplary embodiment of the method is depicted in flow chart form. The method starts with generating 500 a voltage signal responsive to absolute temperature. In an embodiment, the voltage signal will be generated 500 by the electronic circuit 300. The voltage generated by the electronic circuit 300 is proportional to absolute temperature. In an embodiment using electronic circuits 300 manufactured with 65 nm technology, the electronic circuit 300 is configured to provide a voltage change responsive to temperature of approximately 1000 parts per million per degree Celsius. As used herein, the term approximately represents variation resulting from design, material, and manufacturing tolerances. In an embodiment, it may be desired to increase the thermal response of the electronic circuit 300 beyond the typical 1000 parts per million/degree Celsius to enhance the accuracy and resolution of the temperature compensation circuit 315. Accordingly, the method will proceed by amplifying 510 the voltage signal provided by the electronic circuit 300 that is proportional to absolute temperature. In an embodiment, the electronic circuit 300 generates a voltage signal directly proportional to absolute temperature.

While an embodiment of the invention has been described having an electronic circuit with a voltage change responsive to temperature of approximately 1000 parts per million per degree Celsius, it will be appreciated that scope of the invention is not so limited, and that the invention will also apply to VCOs having electronic circuits that have different voltage responses to temperature change.

In an embodiment, based upon the typical operating characteristics of the field effect transformer 335, it will be preferred that the compensating voltage input 325 has a value of about 0.6 volts (V) at 5 degrees Celsius to about 1.1 V at 85 degrees C. One reason to provide this voltage range is that most field effect transistors, such as the field effect transistor 335, discussed above, require a minimum input voltage of about 0.4 V to become responsive. To tune the amplified output of the electronic circuit 300 to these voltage parameters, the method includes configuration of the amplifier 310 and the DC offset generator 320 to generate 520 a DC offset voltage to be summed with the amplified voltage signal. The offset voltage generated by the DC offset generator is used to center the response of the temperature compensated VCO system 100. Finally, the method concludes with supplying 530 the summed voltage signal to the temperature compensation circuit 315 comprising the one or more field effect transistors 335 connected in series with the logic inverter gate 330.

While an embodiment of the invention has been described having a compensating voltage input with a range of about 0.6 volts (V) at 5 degrees Celsius to about 1.1 V at 85 degrees C., it will be appreciated that scope of the invention is not so limited, and that the invention will also apply to VCOs having compensating voltage inputs with other voltage ranges.

Figure 6:
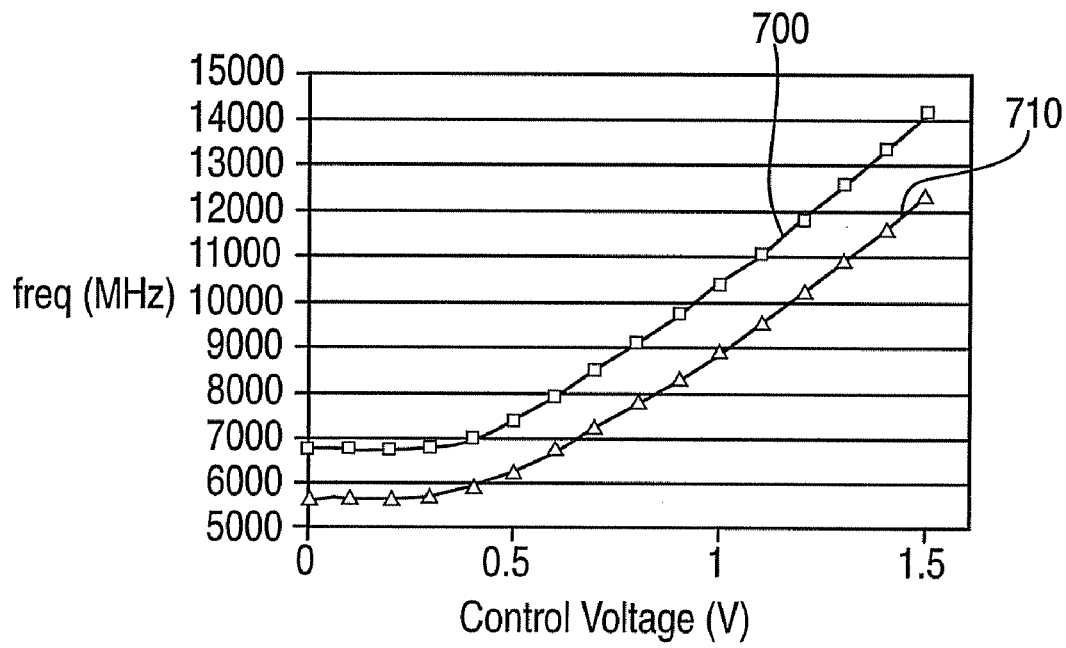
FIG. 6 illustrates one example of a chart depicting a relationship between temperature and frequency for a typical VCO.

Referring now to FIG. 6, a frequency-voltage graph for a typical VCO, with components manufactured by 65 nm technology, at two temperatures is depicted. A line 700 represents the frequency-voltage characteristics of the typical VCO at 5 degrees C. A line 710 represents the frequency-voltage characteristics for the same VCO at 85 degrees C. It will be appreciated from the graph that as the environmental temperature increases, the frequency response of the typical VCO at a given voltage will decrease. This can be as much as 19% variation in frequency for operation between 5 degrees C. and 85 degrees C. It will also be appreciated that for the given voltage, the increase in temperature will limit the maximum attainable clock speed. In the example provided, the clock speed at 1.5 volts can be seen to drop from about 14.1 Giga-Hertz (GHz) to about 12.3 GHz.

Figure 7:
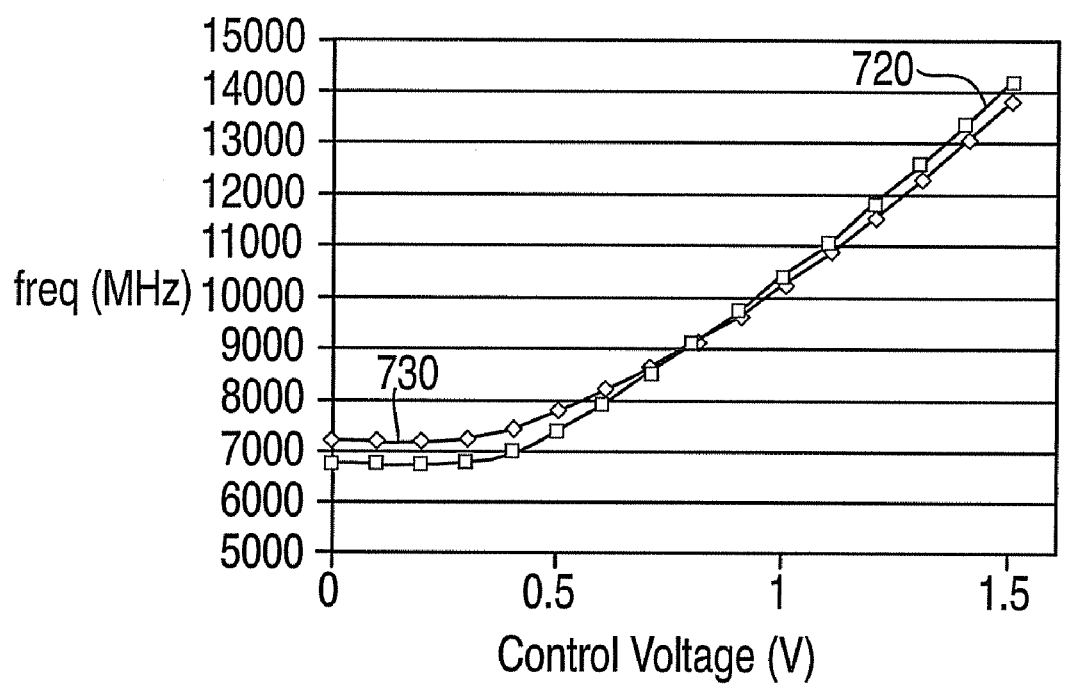
FIG. 7 illustrates one example of a chart depicting a relationship between temperature and frequency for a VCO in accordance with an embodiment of the invention.

Referring now to FIG. 7, a frequency-voltage simulation graph for a VCO configured in accordance with an embodiment of the invention is depicted. The exemplary VCO has been manufactured with 65 nm technology. A line 720 represents the frequency-voltage characteristics of an exemplary embodiment of the VCO at 5 degrees C. A line 730 represents the frequency-voltage characteristics for the same VCO at 85 degrees C. As described above, the DC offset generator 320 can provide the offset voltage to center the response of the temperature compensated VCO system 100, such that the highest system accuracy is provided in the expected range of operation. It will be appreciated from the graph that the temperature sensitivity at the center frequency, which is the nominal operating region, is improved by more than two orders of magnitude, and sensitivity is decreased by more than three times over the full range of the VCO.

Figure 8:
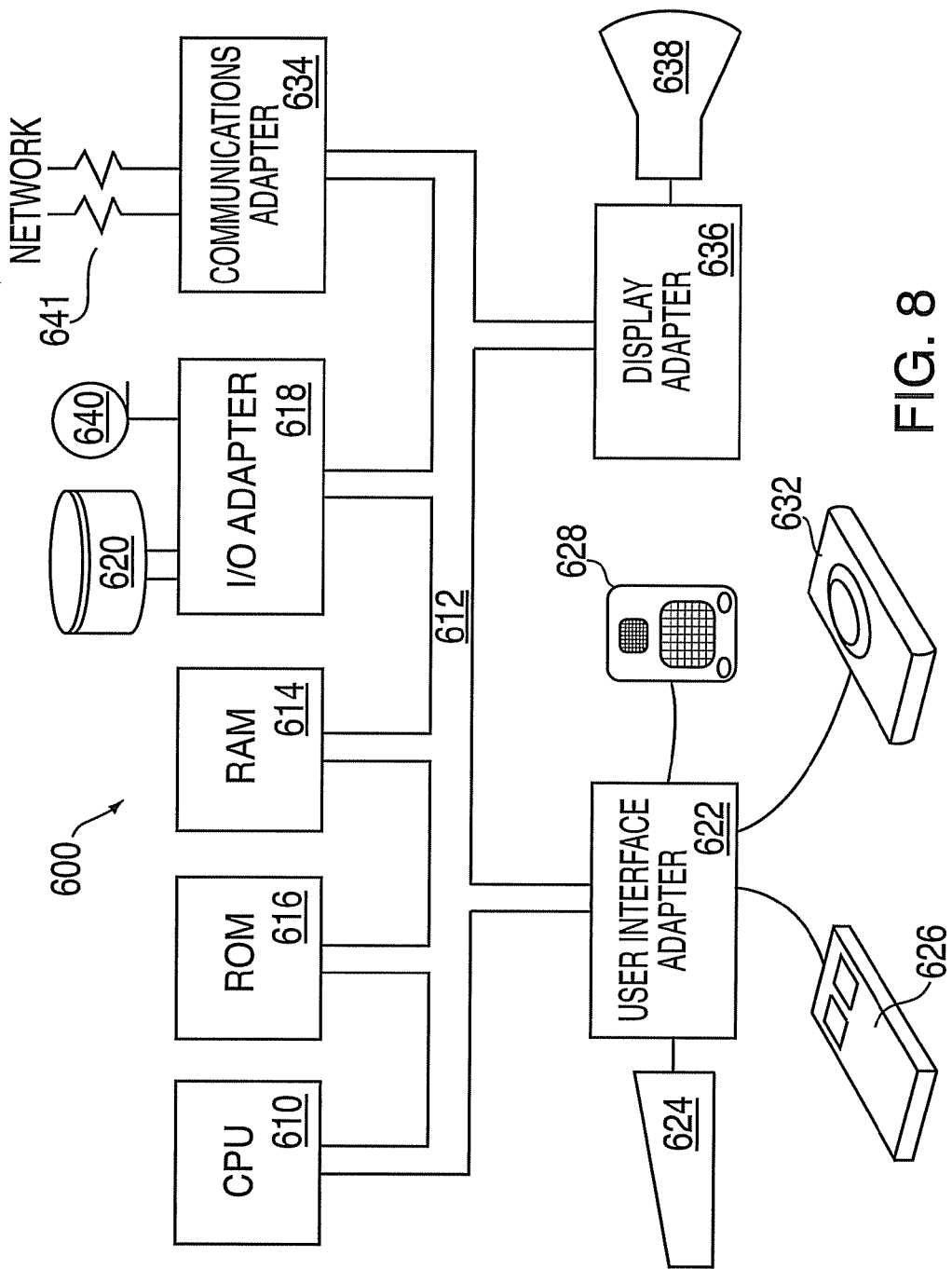
FIG. 8 illustrates one example of a bock diagram of a representative VCO system in accordance with an embodiment of the invention The detailed description explains the preferred embodiments of the invention, together with advantages and features, by way of example with reference to the drawings.

Referring now to FIG. 8, a high level functional block diagram of a representative data processing system 600 suitable for practicing the principles of the present invention is depicted. Data processing system 600 includes a central processing system (CPU) 610 operating in conjunction with a system bus 612. System bus 612 operates in accordance with a standard bus protocol, such as the ISA protocol, compatible with CPU 610. CPU 610 operates in conjunction with ROM (also herein referred to as electronically erasable programmable read-only memory (EEPROM)) 616 and random access memory (RAM) 614. Among other things, EEPROM 616 supports storage of the Basic Input Output System (BIOS) data and recovery code. RAM 614 includes DRAM (Dynamic Random Access Memory) system memory and SRAM (Static Random Access Memory) external cache to store operating commands. I/O Adapter 618 allows for an interconnection between the devices on system bus 612 and external peripherals, such as mass storage devices (e.g., a hard drive, floppy drive or CD/ROM drive), or a printer 640. A peripheral device 620 is, for example, coupled to a peripheral control interface (PCI) bus, and I/O adapter 618 therefore may be a PCI bus bridge. User interface adapter 622 couples various user input devices, such as a keyboard 624, mouse 626, touch pad 632 or speaker 628 to the processing devices on bus 612. Display 638 which may be, for example, a cathode ray tube (CRT), liquid crystal display (LCD) or similar conventional display units. Display adapter 636 may include, among other things, a conventional display controller and frame buffer memory. Data processing system 600 may be selectively coupled to a computer or telecommunications network 641 through communications adapter 634. Communications adapter 634 may include, for example, a modem for connection to a telecom network and/or hardware and software for connecting to a computer network such as a local area network (LAN) or a wide area network (WAN). CPU 610 and other components of data processing system 600 may contain a phase locked loop (PLL) for generating clocks, which operate with a VCO 200 according to embodiments of the present invention.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A data processing system comprising a central processing unit (CPU), operable to generate a clock signal, the CPU having an interleaved voltage-controlled oscillator (VCO) comprising:
    a ring circuit comprising a series connection of main logic inverter gates;
    a plurality of delay elements connected in parallel with a selected sequence of the main logic inverter gates;
    wherein each delay element comprises:
        a feedforward section, comprising controls for regulating signal transmission through feedforward elements responsive to one or more control voltages; and
        a proportional section, comprising controls for regulating signal transmission through at least one logic inverter gate;
    at least one temperature compensation circuit comprising a logic inverter gate in series connection with one or more field effect transistor, the field effect transistors responsive to a compensating voltage input that is proportional to temperature;
    an electronic circuit in signal communication with the at least one temperature compensation circuit and configured to provide a voltage signal responsive to temperature;
    an amplifier in connection with the electronic circuit to amplify the voltage signal;
    a DC offset generator configured to adjust the amplified voltage signal, thereby providing the compensating voltage input;
    a random access memory (RAM) configured to store operating commands;
    a read only memory (ROM) configured to store BIOS and recovery code; and
    an I/O adapter, and a bus system coupling the CPU to the ROM, the I/O adapter, and the RAM.

2. The system of claim 1, wherein:
    the electronic circuit provides a voltage signal directly proportional to temperature.

3. The system of claim 1, wherein:
    the temperature compensation circuit is in parallel connection to the delay element.

4. The system of claim 1, wherein:
    the temperature compensation circuit is in parallel connection to at least one of the main logic inverter gates.

5. The system of claim 1, wherein:
the VCO comprises components manufactured with 65 nanometer (nm) technology employing a lithographic mode of manufacture.

6. The system of claim 1, wherein:
the electronic circuit is configured to provide a voltage change responsive to temperature of approximately 1000 parts per million per degree Celsius.

7. The system of claim 1, wherein:
the amplifier and DC offset generator are configured to provide the compensating voltage input that varies from about 0.6 volts (V) at 5 degrees Celsius to about 1.1V at 85 degrees Celsius.

* * * * *